United States Patent [19]

Masuda

[11] Patent Number: 5,422,859
[45] Date of Patent: Jun. 6, 1995

[54] SEMICONDUCTOR MEMORY SYSTEM FOR MONITORING A SIGNAL OUTPUT, SYNCHRONIZATION WITH DATA OUTPUT FROM A MEMORY DEVICE AND INDICATING THAT THE OUTPUT DATA ARE VALID, BY USING A CPU

[75] Inventor: Masami Masuda, Yokohama, Japan

[73] Assignee: Kabushiki Kaisha Toshiba, Kawasaki, Japan

[21] Appl. No.: 214,773

[22] Filed: Mar. 16, 1994

[30] Foreign Application Priority Data

Apr. 7, 1993 [JP] Japan ................................. 5-079934

[51] Int. Cl.⁶ .............................................. G11C 7/00
[52] U.S. Cl. .................. 365/233.5; 365/191; 365/233
[58] Field of Search ............ 365/233.5, 233, 191, 365/194, 230.03

[56] References Cited

U.S. PATENT DOCUMENTS 4,961,172 10/1990 Shubat .................. 365/233.5 X
5,126,975 6/1992 Handy .................... 365/233
5,210,715 5/1993 Houston .................. 365/194

FOREIGN PATENT DOCUMENTS 61-5493 1/1986 Japan ..................... 365/233.5

*Primary Examiner*—Joseph A. Popek
*Assistant Examiner*—Son Mai
*Attorney, Agent, or Firm*—Spensley Horn Jubas & Lubitz

[57] ABSTRACT

A semiconductor memory system has a central processing unit (CPU) for supplying an address signal to any one of a plurality of memories for storing data and processing data read out from an address corresponding to the address signal. The memory outputs data addressed in response to an address signal from the central processing unit. The system further comprises a circuit for generating a STAT signal representing that the output data is valid. The STAT signal is output in synchronization with the output data, and monitored by the central processing unit, thereby controlling a cycle of operations for reading data from the plurality of memories.

8 Claims, 2 Drawing Sheets

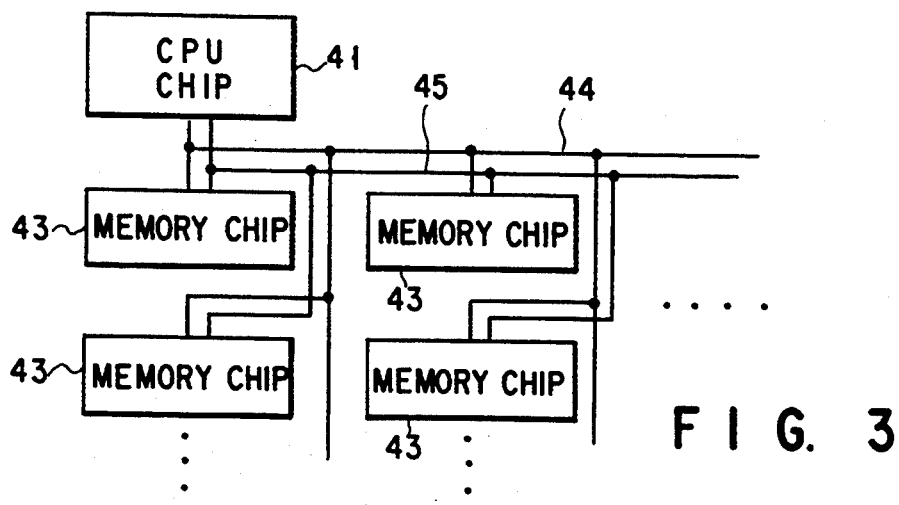
F I G. 3

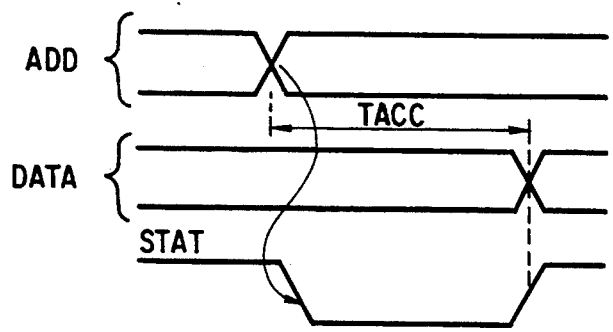
F I G. 4
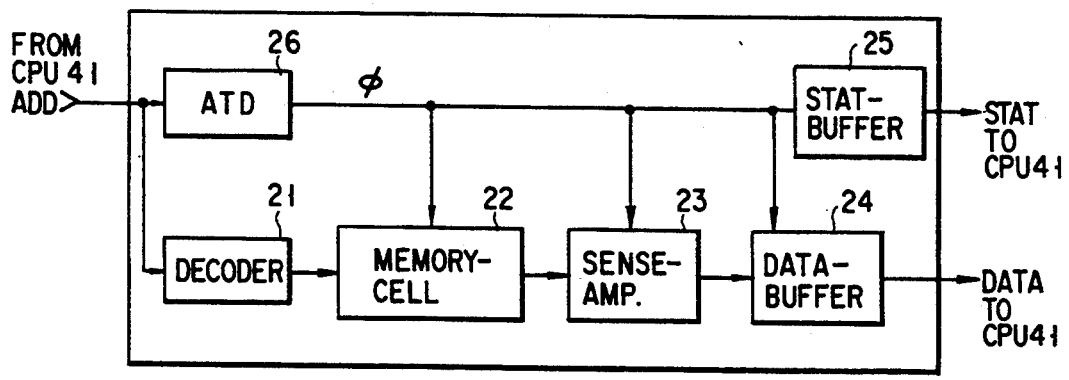
F I G. 5
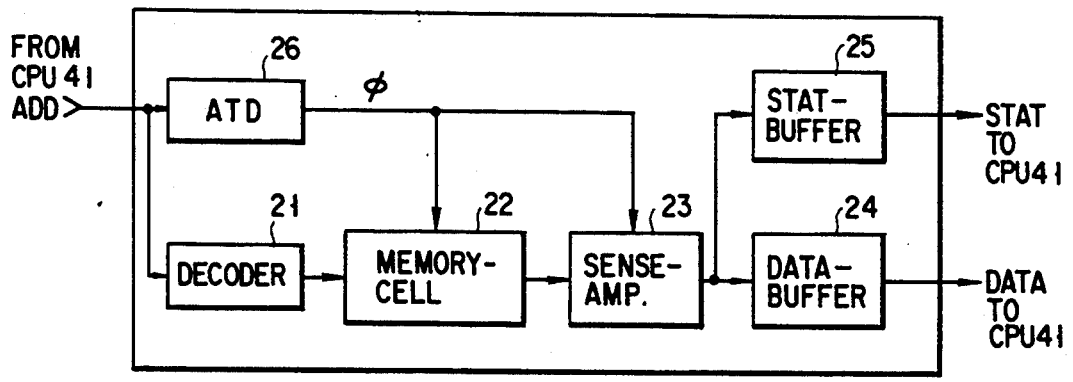
F I G. 6

SEMICONDUCTOR MEMORY SYSTEM FOR MONITORING A SIGNAL OUTPUT, SYNCHRONIZATION WITH DATA OUTPUT FROM A MEMORY DEVICE AND INDICATING THAT THE OUTPUT DATA ARE VALID, BY USING A CPU

BACKGROUND OF THE INVENTION

1. Field of the Invention

The present invention relates to a semiconductor memory system including a semiconductor memory device such as a cache memory for outputting data upon reception of an address from a CPU and, more particularly, to a highly-efficient, high-speed semiconductor memory system wherein a CPU monitors a signal which is generated in synchronization with data output from a memory and represents that the output data is valid and controls a cycle of operations for reading data from the memory to thereby reduce a wait of the CPU.

2. Description of the Related Art

FIG. 1 is a block diagram showing a conventional semiconductor memory system using a CPU (Central Processing Unit). In this system, a memory control chip 42 is connected to a CPU chip 41, and a plurality of memory chips 43 are connected to the memory control chip 42 through a bus for transmitting addressing signals, data, control signals, and the like. FIG. 2 is a block diagram showing another conventional semiconductor memory system using a CPU. In this system, a CPU 41 is directly connected to a plurality of memory chips 43.

Memories are generally essential for configuring a semiconductor memory system using a CPU. In order to enhance the efficiency of the system, usually, a number of memory chips serving as secondary cache memories are arranged in addition to a CPU chip on which a small-sized memory such as a register or a cache memory is mounted. In the system shown in FIG. 1, the memory control chip 42 for controlling a memory such as a cache controller is disposed between the CPU 41 and the memory chips 43, and the CPU chip 41 and memory control chip 42 are connected by wiring on a substrate as are the memory control chip 42 and the memory chips 43. As shown in FIG. 2, there has recently been a method of directly connecting the memory chips 43 to the CPU chip 41 having a function of the memory control chip in order to heighten the efficiency of the system further. In the system shown in FIG. 2, the time for one cycle of the CPU which allows the memory to perform a reading operation corresponds to the time required from when the CPU outputs an addressing signal until the memory outputs data to the data bus in response to the addressing signal and until the CPU receives the data. The shortest cycle time of the CPU depends upon the capacity thereof, and the memory allows high-speed access so that the reading operation can be performed within the cycle time.

As the efficiency of the system is improved and the shortest cycle time of the CPU is reduced, a delay in access due to the wiring of an address bus or a data bus increases. It is thus necessary to increase the speed of memory access more than that of the CPU. Since, however, there is a limit to the speed of memory access, a considerably high-speed memory cannot be provided for a CPU of the same generation. For this reason, the reading operation cannot be performed within the shortest cycle time, and a wait is necessary for the CPU, resulting in the degradation of the efficiency of the entire system. This problem becomes more serious as the delay due to wiring, which is proportionate to the length of the wiring, increases. In other words, the larger the size of the memory, the longer the length of the wiring, thus causing a decrease in the efficiency of the system. There is a difference in time required for the reading operation, which corresponds to a difference in delay due to wiring, between a memory chip near the CPU and a memory chip far from the CPU, and the cycle time of the CPU is determined by the access time of the farthest memory chip. The delay due to wiring is chiefly caused by a parasitic inductance and, thus, it is very difficult to correctly obtain the exact amount of time involved in the delay in the system. Therefore, the reading operation cannot be completed within the cycle time of the CPU, the failure of which should be avoided in order to prevent the system from malfunctioning.

As described above, the conventional semiconductor memory system has the following drawback: If the efficiency of the CPU is heightened, then a delay due to wiring occurs in the memory. The cycle time of the CPU can be shortened only to such an extent that the delay does not cause the system to malfunction. Therefore, the efficiency of the system cannot be enhanced greatly.

SUMMARY OF THE INVENTION

The present invention has been developed in consideration of the above situation, and its object is to provide a highly-efficient, high speed semiconductor memory system which is capable of controlling the cycle time for reading data from a memory in accordance with a delay in transmission of data or signals which is due to a difference in length between the wirings of a plurality of memories connected to a CPU and keeping a wait of the CPU to the minimum amount of time essential to prevent the CPU from malfunctioning.

To attain the above object, a semiconductor memory system according to the present invention comprises:

memory means including a plurality of memories for storing data;

a central processing unit (CPU) for supplying an address signal to one of the plurality of memories of the memory means and processing data read out from an address corresponding to the address signal; and STAT signal generating circuit means for generating a STAT signal output in synchronization with data read out from each of the plurality of memories and representing that the data is valid data output in response to an externally input address signal, the STAT signal being monitored by the central processing unit (CPU).

Since a semiconductor memory system according to the present invention has the above constitution, the cycle time for reading data from a memory can be controlled in accordance with a delay in transmission of data or signals which is due to a difference in length between the wirings of a plurality of memories connected to a CPU, and a wait of the CPU is kept to the minimum amount of time essential to prevent the CPU from malfunctioning.

BRIEF DESCRIPTION OF THE DRAWINGS

The accompanying drawings, which are incorporated in and constitute a part of the specification, illus

FIG. 3 is a block diagram showing a constitution of a semiconductor memory system according to the present invention;

FIG. 4 is a timing chart showing signals output from memory chips of the semiconductor memory system of FIG. 3;

FIG. 5 is a block diagram showing one embodiment of the main part of the semiconductor memory system of FIG. 3; and FIG. 6 is a block diagram showing another embodiment of the main part of the semiconductor memory system of FIG. 3.

DETAILED DESCRIPTION OF THE PREFERRED EMBODIMENTS

Figure 1:
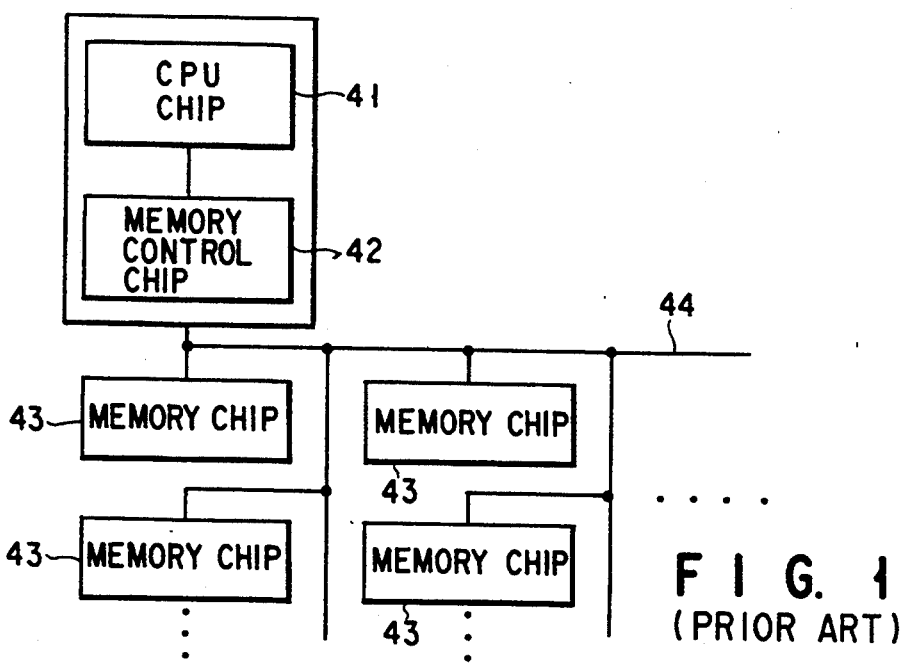
- FIG. 1 is a block diagram showing a constitution of a conventional semiconductor memory system.
Figure 2:
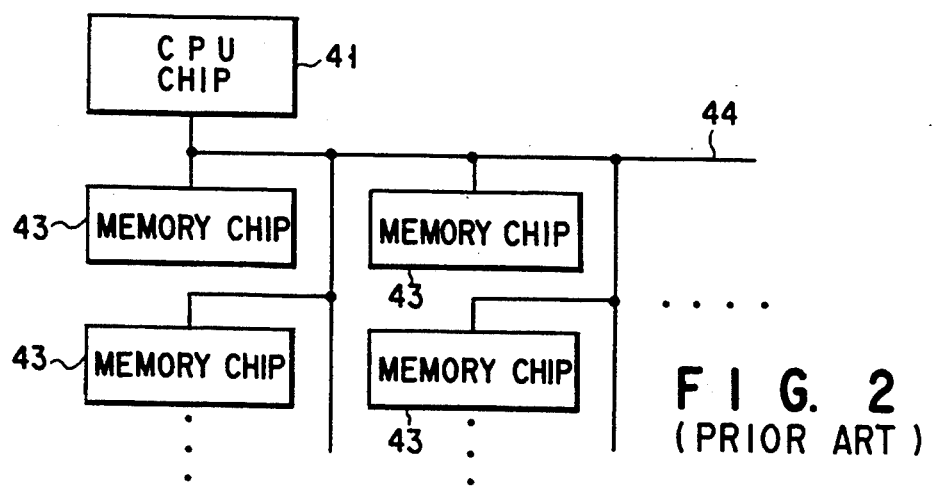
FIG. 2 is a block diagram showing a constitution of another conventional semiconductor memory system.

FIG. 3 is a block diagram showing a constitution of a semiconductor memory system according to the present invention. In this system, a CPU chip 41 is connected to each of a plurality of memory chips 43 through a bus 44 for transmitting address signals, data, control signals, and the like and a bus 45 for transmitting a signal representing that data output from the memory chips 43 is valid. The CPU chip 41 has a function of a memory control chip, as in the system shown in FIG. 2.

If an addressing signal ADD is supplied from the CPU chip 41 to a predetermined memory chip 43 through the bus 44, the memory chip 43 outputs data from an address specified after a lapse of access time (tACC). In synchronization with the timing of the output data, a STATUS (hereinafter referred to as STAT) signal is output. As shown in the timing chart shown in FIG. 4, the STAT signal is changed from validity (binary 1) to invalidity (binary 0) in response to the address signal ADD, and returned to the validity (binary 1) after a lapse of access time (tACC). The STAT signal is then transmitted through the bus 45 to the CPU chip 41 and monitored therein. Therefore, the STAT signal can be considered to be a valid signal indicating that the data output from the memory chip 43 is valid data corresponding to the address signal.

One embodiment of the main part of the semiconductor memory system, which processes the signals output from the memory chips as shown in the timing chart of FIG. 4, will now be described with reference to FIG. 5.

An address signal is supplied from the CPU chip 41 to an ATD (address transition detector) 26 and a decoder 21. The decoder 21 is connected to a memory cell 22, the memory cell is connected to a sense amplifier 23, and the sense amplifier is connected to a data buffer 24. Data of an address specified in the memory cell 22 is read out from the data buffer 24.

The ATD 26 generates a pulse $\phi$ and sends it to a stat-buffer 25. The stat-buffer 25 outputs a STAT signal. Since the pulse $\phi$ is simultaneously supplied to the memory cell 22, sense amplifier 23, and data buffer 24 as a drive signal, the timing at which data amplified by the sense amplifier 23 is output from the data buffer 24, can be controlled by the timing of generation of the pulse $\phi$.

If the specified address is changed to another one, its corresponding data is read out from a new memory cell 22 and output via the sense amplifier 23 and data buffer 24. In response to a pulse $\phi$ generated according to the change in address, the bit line of the memory cell 22, and the sense amplifier 23 are equalized in order to achieve high-speed access.

In the above embodiment, not only a period of time during which the STAT signal issued from the stat-buffer 25 remains valid (binary 1) can be synchronized with the timing at which data is output from the memory chip, but also the timing at which the STAT signal is output can be shifted from the timing at which data is output.

FIG. 6 is a block diagram showing another embodiment of the main part of the semiconductor memory system according to the present invention. This is the same embodiment as shown in FIG. 5, except that the pulse $\phi$ output from the ATD 26 is supplied only to the memory cell 22 and sense amplifier 23, and the signal output from the sense amplifier 23 is input to the data buffer 24 and stat-buffer 25. The description of the constitution is therefore omitted.

According to the embodiment shown in FIG. 6, the STAT signal is output from the stat-buffer 25 upon reception of an output signal from the sense amplifier 23. In other words, the STAT signal is easy to synchronize with data since it is generated directly by the reading operation of the sense amplifier 23 in accordance with the equalizing operation of the sense amplifier 23.

As is evident from the embodiments described above, data read from each of the memory chips in response to an address signal, is synchronized with the STAT signal generated in response to the same address signal, irrespective of a difference in length of wiring, and the validity of the data can be confirmed by monitoring the STAT signal by the CPU. Consequently, a highly-efficient, high-speed semiconductor memory system can be achieved in which the cycle of reading data from a memory is controlled and the wait of the CPU is set to an appropriate amount of time, thereby to prevent the CPU from malfunctioning.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory system comprising:
   memory means including a plurality of memories for storing data;
   a central processing unit (CPU) for supplying an address signal to one of the plurality of memories of said memory means and processing data read out from an address corresponding to the address signal; and
   STAT signal generating circuit means for generating a STAT signal output in synchronization with data read out from each of the plurality of memories and representing that the data are valid data output in response to said address signal, said STAT signal being monitored by said central processing unit (CPU).

2. The semiconductor memory system according to claim 1, wherein said STAT signal generating circuit means includes:
   address signal transition detecting means for detecting transition of said address signal and outputting a pulse in accordance with the transition; and
   STAT signal outputting circuit means connected to said address signal transition detecting means, for outputting the STAT signal upon reception of the pulse.

3. The semiconductor memory system according to claim 2, wherein said STAT signal outputting circuit means supplies the pulse output from said address signal transition detecting means to said one of the plurality of memories and said STAT signal generating circuit means, and outputs the STAT signal in synchronization with data output after a lapse of access time for said one of the plurality of memories.

4. The semiconductor memory system according to claim 2, wherein said STAT signal generating circuit means supplies the pulse output from said address signal transition detecting means to said one of the plurality of memories, and controls output timing of data read out from said one of the plurality of memories.

5. A memory system comprising:
   memory means including a plurality of memories for storing data;
   a central processing unit (CPU) for supplying an address signal to one of said plurality of memories and processing data read out from an address corresponding to the address signal; and
   STAT signal generating circuit that generates a STAT signal identifying valid data output by said one of said plurality of memories, said STAT signal being monitored by said central processing unit (CPU).

6. The memory system of claim 5, wherein said STAT signal generating circuit includes:
   an address transition detector for detecting a transition of said address signal and outputting a pulse in accordance with said transition of said transition signal; and
   a STAT signal buffer coupled to said address transition detector, for outputting said STAT signal upon reception of said pulse.

7. The memory system of claim 6, wherein said STAT signal output by said STAT signal buffer is delayed with respect to said pulse to synchronize said STAT signal with said output of valid data by said one of said plurality of memories.

8. The memory system of claim 6 further comprising a sense amplifier coupled to receive said pulse from said address transition detector, said sense amplifier generating a second pulse and supplying said second pulse to said STAT signal buffer so that said STAT signal buffer outputs said STAT signal in response to said second pulse.

* * * * *